United States Patent [19]

Yamanoi et al.

[11] Patent Number: 4,802,168

[45] Date of Patent: Jan. 31, 1989

[54] TEST SIGNAL GENERATING CIRCUIT

[75] Inventors: Koyu Yamanoi; Yoshio Yoshizakiya; Masayoshi Dehara, all of Tokyo, Japan

[73] Assignee: Ando Electric Co., Ltd., Tokyo, Japan

[21] Appl. No.: 11,175

[22] Filed: Feb. 5, 1987

[30] Foreign Application Priority Data

Feb. 7, 1986 [JP] Japan .................................. 61-25178

[51] Int. Cl.$^4$ .............................................. G06F 3/04
[52] U.S. Cl. ......................................... 371/27; 371/28
[58] Field of Search ................. 371/27, 25, 15, 16, 371/21, 23, 24; 324/73 R, 73 A T; 377/19, 26

[56] References Cited

U.S. PATENT DOCUMENTS

| 3,952,253 | 4/1976 | DeVolpi et al. | 328/63 |
| 4,131,855 | 12/1978 | Hamagawa | 328/129 |
| 4,306,190 | 12/1981 | Beckwith et al. | 328/62 |
| 4,429,389 | 1/1984 | Catiller | 371/21 |
| 4,450,560 | 5/1984 | Conner | 371/25 |
| 4,523,289 | 6/1985 | Soma et al. | 364/569 |
| 4,555,663 | 11/1985 | Shimizu | 324/73 |
| 4,573,175 | 2/1986 | Cressey et al. | 377/44 |
| 4,584,683 | 4/1986 | Shimizu | 371/25 |
| 4,641,306 | 2/1987 | Annecke | 371/25 |
| 4,672,307 | 6/1987 | Breuer | 371/27 |
| 4,680,479 | 7/1987 | Alonso | 307/265 |
| 4,710,932 | 12/1987 | Hiroshi | 371/27 |
| 4,719,375 | 1/1988 | Martin | 307/600 |

FOREIGN PATENT DOCUMENTS

| 0208049 | 1/1987 | European Pat. Off. . |
| 60-67869 | 4/1985 | Japan . |
| 60-96023 | 5/1985 | Japan . |
| 61-75615 | 4/1986 | Japan . |
| 2070827 | 9/1981 | United Kingdom . |

Primary Examiner—Michael R. Fleming
Attorney, Agent, or Firm—Seidel, Gonda, Lavorgna & Monaco

[57] ABSTRACT

A test signal generating circuit for generating a test signal for testing logic circuits comprises four delay units each including a setting circuitry for setting a delay time, a gate and a counter for counting clock pulses in number corresponding to the delay time placed in the setting circuitry. The output signals of two delay units are applied to a flip-flop as set input signals, while the output signals of the other two delay units are applied to the flip-flop as reset input signals, whereby the timing and/or waveform of the test signal outputted by the flip-flop is varied in dependence on the values placed in the setting circuitries.

2 Claims, 2 Drawing Sheets

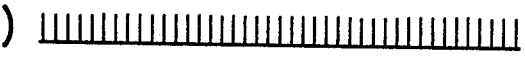
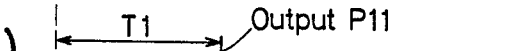
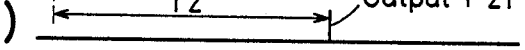
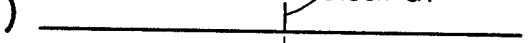
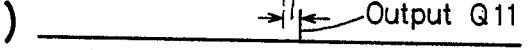
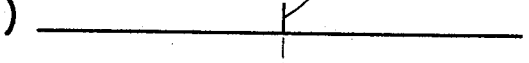
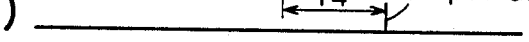
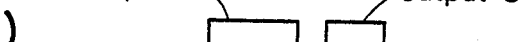

TEST SIGNAL GENERATING CIRCUIT

BACKGROUND OF THE INVENTION

1. Field of the Invention

The present invention generally relates to a test signal generating circuit for generating a test signal for testing logic circuits. More particularly, the present invention relates to a test signal generating circuit which is so arranged as to be capable of delaying the timing at which a test signal is produced for a given time and varying the waveform of the test signal.

2. Description of the Prior Art

In the hitherto known apparatus for testing ICs, a plurality of waveform shaping units are employed for generating logic waveforms of test patterns to be applied to individual pins of an IC device under test, wherein the basic timing signals to be supplied to the plural waveform shaping units are collectively produced by a single timing signal generating unit. With such arrangement, it is difficult or even impossible to assure acceptable timing accuracy for the output signals of the individual waveform shaping units because of non-uniformity in the delay times involved by logic elements of the plural waveform shaping units, crosstalk occurring between the logic signals and the like factors.

SUMMARY OF THE INVENTION

It is an object of the present invention to provide a test signal generating circuit for an apparatus for testing ICs having tendency of the number of pins being increased which circuit can enhance the accuracy of the timing under which the logic waveform is supplied to a device under test while capable of supplying the timing signals to the pins of the device individually and independent of one another.

In view of the above object, there is provided according to an aspect of the invention a test signal generating circuit for generating a test signal for testing logic circuits which circuit comprises four delay units each including a setting circuitry for setting a delay time, a gate and a counter for counting clock pulses in a number corresponding to the delay time set at the setting circuitry. The output signal of two delay units are applied to a flip-flop as set input signals, while the output signals of the other two delay units are applied to the flip-flop as reset input signals, whereby the timing and/or waveform of the test signal outputted by the flip-flop is varied in dependence on the values placed in the setting circuitry.

By incorporating the timing generating circuit in the test siganl generating circuit according to the teaching of the invention, it is now possible to correct individually the non-uniformity or dispersion in the timing possibly occurring among the pins of the device under test by making use of the logic signals. Besides, the timing can be established independently and separately for each of the pins.

The above object, advantages and novel features of the invention will be more apparent upon reading the following detailed description taken in conjunction with the accompanying drawings.

BRIEF DESCRIPTION OF THE DRAWINGS

FIG. 2(a)–2(o) are a view showing a time chart for illustrating operation of the test signal generating circuit shown in FIG. 1.

DESCRIPTION OF THE PREFERRED EMBODIMENTS

Figure 1:
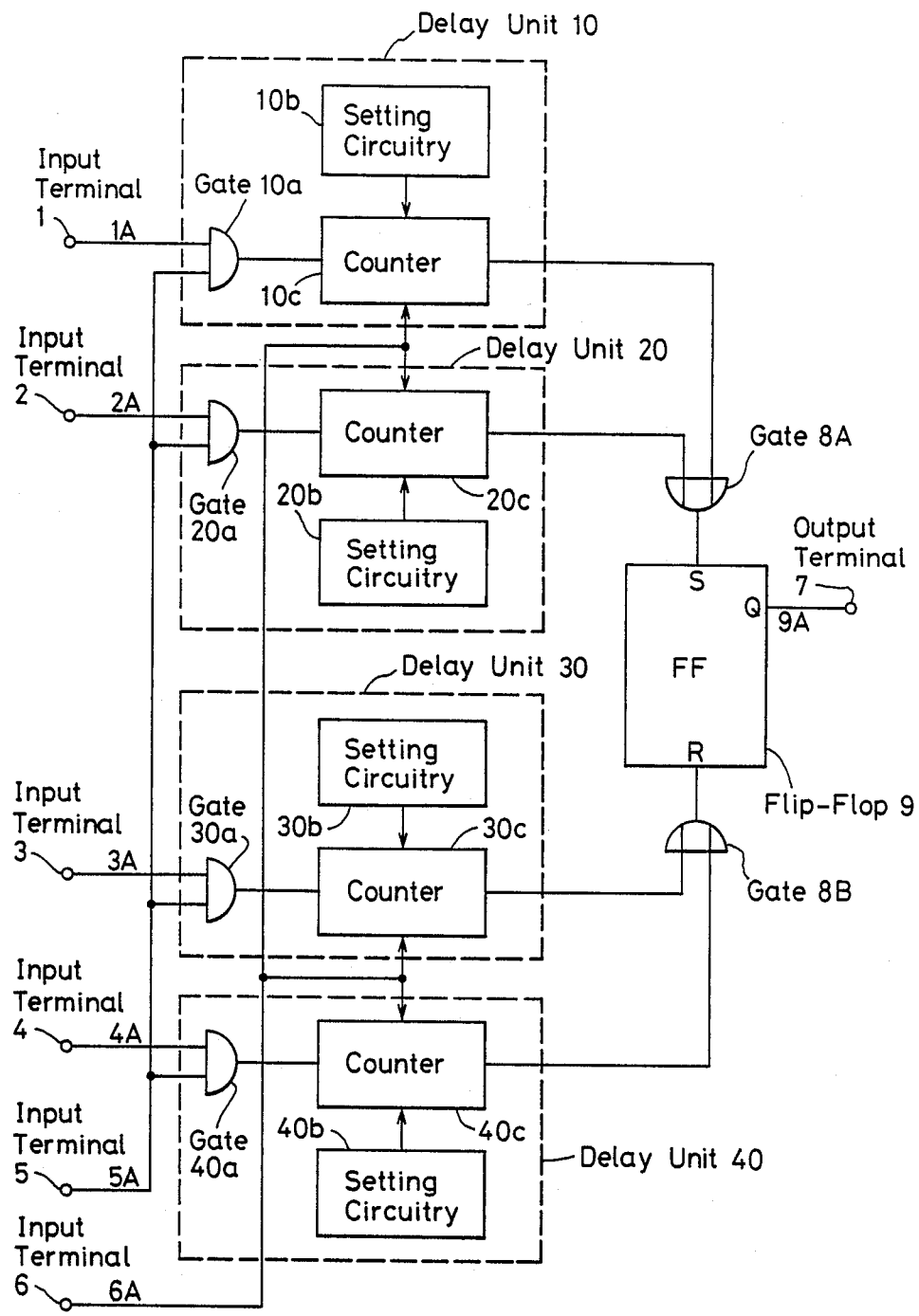
FIG. 1 is a circuit diagram showing schematically a general arrangement of the test signal generating circuit according to an exemplary embodiment of the invention.

Now, the invention will be described in conjunction with an exemplary embodiment thereof shown in FIG. 1.

Referring to FIG. 1, reference numerals 1 to 6 denote input terminals, respectively, 7 denotes an output terminal, 8A and 8B denote gates, respectively, 9 denotes a flip-flop, and reference numerals 10, 20, 30 and 40 denotes delay units.

The delay unit 10 includes a gate circuitry 10a, a setting circuitry 10b and a counter 10c interconnected in the manner as shown. Each of the remaining delay units 20, 30 and 40 is of a same structure as the delay unit 10. Accordingly, the following description is primarily directed to the operation of the delay unit 10, being understood that the description holds true for the other delay units unless specified otherwise.

Referring to FIG. 1, signals 1A to 4A are applied to input terminals 1 to 4, respectively, while a reference signal 5A is applied to an input terminal 5. A clock signal 6A is applied to the clock input terminal 6. A test signal 9A is derived from the output terminal 7.

The input signal 1A is a digital signal having binary logic levels "1" and "0". The reference signal 5A serves as a reference for the repetition period of the input signal 1A. In other words, it is so arranged that the repetition period of the signal 1A coincides with the period of the reference signal 5A.

The clock signal 6A has a shorter repetition period than that of the reference signal 5A and is applied to the counter 10c of the delay unit 10.

The input signal 1A and the reference signal 5A are applied to the gate 10a of the delay unit 10. When the signal 1A is "1", the reference signal 5A is transmitted to the counter 10c of the delay unit 10.

The setting circuitry 10b of the delay unit 10 serves to set a delay time at the counter 10c of the delay unit 10. To this end, the setting circuitry 10b may be constituted by a memory in which a set value corresponding to a desired delay time may be previously stored from a central processing unit or CPU (not shown).

The setting circuitry 10b of the delay unit 10 sends the set value corresponding to a first delay time to the counter 10c, whereby the counter 10c is loaded with the set value corresponding to the first delay time under the timing of the reference signal 5A. The counter 10c of the delay unit 10 counts the clock pulses 6A in a number corresponding to the loaded set value, whereby a signal delayed for the first delay time relative to the reference signal 5A is applied to one input of a gate 8A.

It is assumed, by way of example, that the period of the clock signal 6A is 10 ns. On the assumption, in order to have the first delay time be equal to 900 ns, the set value of "90" may be placed in the counter 10c of the delay unit 10.

In a similar manner, the delay unit 20 applies to the other input of the gate 8A a signal delayed relative to the reference signal 5A for a second delay time.

On the other hand, the delay units 30 and 40 apply signals to a gate 8B which signals are delayed relative to the reference signal 5A for third and fourth delay times, respectively.

The gates 8A and 8B are each constituted by an OR gate. The output of the OR gate 8A sets a flip-flop 9, while the output of the gate 8B resets the flip-flop 9. Accordingly, the flip-flop 9 is set in response to the output signals of the delay units 10 and 20, respectively, while it is reset by the output signals of the delay units 30 and 40. In this connection, it should be mentioned that the first to fourth delay times may be of a same duration or different durations.

FIG. 2 shows a time chart for illustrating operation of the test signal generating circuit shown in FIG. 1.

In FIG. 2, the waveforms of the aforementioned signals 1A to 4A are illustrated at (a) to (d), respectively. As will be seen in FIG. 2, the waveforms (a) and (b) are same and the waveforms (c) and (d) are same, wherein the waveform (c) corresponds to inversion of the waveform (a).

The waveform of the reference signal 5A is shown at (e) in FIG. 2. As will be seen, the reference signal 5A includes clock pulses P and Q. The waveform of the clock signal 6A is illustrated at (f) in FIG. 2.

There is shown in FIG. 2 at (g) a waveform of the reference signal 5A outputted from the gate 10a of the delay unit 10 when the signal shown at (a) in FIG. 2 assumes logic "1" level. A clock pulse P1 shown at (g) in FIG. 2 corresponds to the clock P shown at (e).

The output waveform of the delay unit 10 is shown at (h) in FIG. 2. As will be seen, the output P11 shown at (h) is delayed for a delay time T1 relative to the clock P1 shown at (g) in FIG. 2.

Shown at (i) in FIG. 2 is a waveform of the reference signal 5A outputted from the gate 20 of the delay unit 20 at the time when the signal shown at (b) assumes logic "1", wherein the clock P2 corresponds to the clock P shown at (e) in FIG. 2.

Shown at (j) in FIG. 2 is the signal waveform outputted from the delay unit 20. As will be seen, the output signal P21 is delayed for a delay time T2 relative to the clock P2 shown at (i) in FIG. 2.

Shown at (k) in FIG. 2 is a waveform of the reference signal 5A outputted from the gate 30a of the delay unit 30 at the time the signal shown at (c) assumes logic "1", wherein the clock Q1 shown at (k) corresponds to the clock Q shown at (e) in FIG. 2.

Shown at (l) in FIG. 2 is the output waveform of the delay unit 30. As will be seen, the output signal Q11 shown at (l) in FIG. 2 is delayed for a delay time T3 relative to the clock Q1 shown at (k) in FIG. 2.

Shown at (m) in FIG. 2 is the waveform of the reference signal 5A outputted from the gate 40a of the delay unit 40. The clock Q2 shown at (m) in FIG. 2 corresponds to the clock Q shown at (e) in FIG. 2.

Shown at (n) in FIG. 2 is the output waveform of the delay unit 40. It will be seen that the output signal Q21 is delayed by a delay time T4 relative to the clock Q2 shown at (m) in FIG. 2.

Shown at (o) in FIG. 2 is the waveform of the test signal 9A outputted from the flip-flop 9. More specifically, the output signal R shown at (o) in FIG. 2 is produced by the flip-flop 9 when the latter is set in response to the output P11 shown at (h) in FIG. 2 and reset by the output signal Q11 shown at (1) in FIG. 2. Further, the output signal S shown at (o) in FIG. 2 is produced by the flip-flop 9 when it is set by the signal P21 shown at (j) in FIG. 2 and reset by the signal Q21 shown at (n).

Although the output signal of the flip-flop 9 is illustrated over two periods at (o) in FIG. 2, it will be understood that the waveform shown at (o) in FIG. 2 is obtained consecutively from the output of the flip-flop 9 because the signals 1A to 4A and the reference signal 5A are repetitive signals.

As will be appreciated from the foregoing description, the timing of the test signal outputted from the flip-flop 9 can be delayed for a desired time with the waveform of the test signal being varied in a facilitated manner by virtue of such arrangement in which the first to fourth delay times are set in the counters 10c to 40c of the delay units 10 to 40, respectively, wherein the clock signal 6A is counted by these counters.

Although the invention has been described in conjunction with a preferred embodiment thereof, it is obvious that changes and modifications will readily occur to those skilled in the art without departing from the spirit and scope of the invention.

We claim:

1. A test signal generating circuit, comprising:
first, second, third and fourth delay units each including a gate for a predetermined input binary signal for providing an output pulse when the gate is enabled by a repetitive reference signal having a constant interval, a setting circuit for setting a pulse number corresponding to any desired delay period of time, a counter for counting clock pulses given to said counter in a number corresponding to the set number placed in the setting circuit starting from the time when said counter received said output pulse from said gate and for providing an output pulse when said number is reached; and
a flip-flop having a set input terminal to which the outputs from said first and second delay units are applied and a reset input terminal to which the outputs from said third and fourth delay units are applied for obtaining a test signal at an output terminal thereof.

2. A test signal generating circuit according to claim 1, wherein said setting circuitry is constituted by a memory for storing a value supplied from a central processing unit.

* * * * *